(12) United States Patent
Fujimura et al.

(10) Patent No.: US 10,365,448 B2
(45) Date of Patent: Jul. 30, 2019

(54) OPTICAL MODULE HAVING TWO LENS SYSTEM AND MONITOR PHOTODIODE BETWEEN TWO LENSES

(71) Applicant: Sumitomo Electric Industries, Ltd., Osaka-shi (JP)

(72) Inventors: Yasushi Fujimura, Yokohama (JP); Tomoya Saeki, Yokohama (JP); Shunsuke Sato, Yokohama (JP); Munetaka Kurokawa, Yokohama (JP); Manabu Shiozaki, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/844,120

(22) Filed: Dec. 15, 2017

(65) Prior Publication Data
US 2019/0187391 A1    Jun. 20, 2019

(51) Int. Cl.
| G02B 6/42 | (2006.01) |
| G02B 6/293 | (2006.01) |
| G02B 27/30 | (2006.01) |
| G02B 27/14 | (2006.01) |
| G02B 1/115 | (2015.01) |
| H01L 31/0216 | (2014.01) |
| H01L 31/0304 | (2006.01) |
| H01L 31/0232 | (2014.01) |
| H01L 31/105 | (2006.01) |
| G02B 3/08 | (2006.01) |

(52) U.S. Cl.
CPC .......... *G02B 6/4286* (2013.01); *G02B 1/115* (2013.01); *G02B 6/29367* (2013.01); *G02B 6/425* (2013.01); *G02B 6/4257* (2013.01); *G02B 27/142* (2013.01); *G02B 27/30* (2013.01); *H01L 31/02161* (2013.01); *H01L 31/02325* (2013.01); *H01L 31/03046* (2013.01); *H01L 31/105* (2013.01); *G02B 3/08* (2013.01)

(58) Field of Classification Search
CPC ... G02B 6/4286; G02B 6/29367; G02B 6/425
See application file for complete search history.

(56) References Cited

U.S. PATENT DOCUMENTS

| 6,646,745 B2 * | 11/2003 | Verma | G01J 9/0246 356/450 |
| 2003/0190124 A1 * | 10/2003 | Kuhara | G02B 6/421 385/88 |

(Continued)

FOREIGN PATENT DOCUMENTS

JP    2011-253987 A    12/2011

*Primary Examiner* — Sung H Pak
(74) *Attorney, Agent, or Firm* — Baker Botts LLP; Michael A. Sartori

(57) ABSTRACT

An optical module with a laser diode (LD) without any temperature control and an optical fiber that is coupled with the LD through the two lens system is disclosed. The two lens system first converts laser beam into collimated beam and second concentrates the collimated beam onto the optical fiber. A beam splitter is disposed between the lenses and splits the collimated beam toward a photodiode (PD). The PD, which receives the split collimated beam in a back surface thereof, provides an anti-reflection film in the back surface. The anti-reflection film eliminates multi reflections occurred within the PD.

9 Claims, 10 Drawing Sheets

(56) References Cited

U.S. PATENT DOCUMENTS

| | | | | |
|---|---|---|---|---|
| 2008/0298402 A1* | 12/2008 | Rossi | .................. | H01S 5/02248 |
| | | | | 372/20 |
| 2010/0226655 A1* | 9/2010 | Kim | .................... | G02B 6/4246 |
| | | | | 398/139 |
| 2016/0282174 A1* | 9/2016 | Hasegawa | ............. | G01J 1/0214 |

* cited by examiner

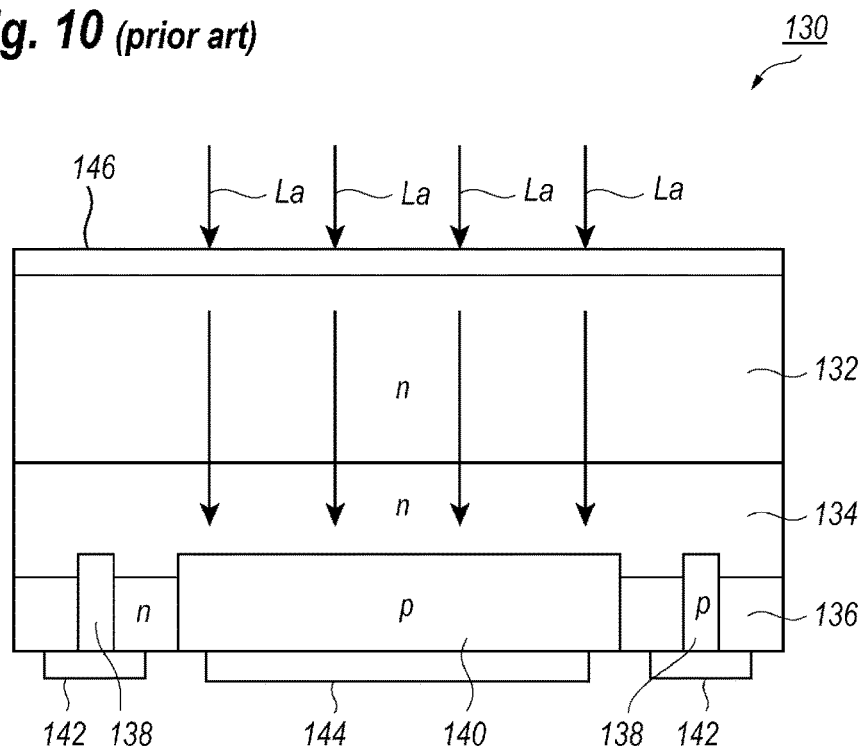
Fig. 10 *(prior art)*

US 10,365,448 B2

OPTICAL MODULE HAVING TWO LENS SYSTEM AND MONITOR PHOTODIODE BETWEEN TWO LENSES

BACKGROUND OF THE INVENTION

1. Field of the Invention

The present invention relates to an optical module.

2. Background Arts

A Japanese Patent laid open No. 2011-253987A has disclosed a semiconductor light-receiving device and an optical module implementing the same. FIG. 10 schematically shows a cross section of the semiconductor light-receiving device 130 disclosed therein. The semiconductor light-receiving device 130 stacks an n-type InGaAs layer 134 and an n-type InP layer 136 on an n-type InP substrate 132. The n-type InP substrate 132 provides a top layer and a bottom layer opposite to the top layer. The n-type InGaAs layer 132, which is provided on the n-type InP substrate 132, has bandgap energy smaller than bandgap energy of the n-type InP substrate 132. The n-type InP layer 136, which is provided on the n-type InGaAs layer 134, in portions thereof has p-type regions, 138 and 140. A cathode electrode 138 is in contact with the p-type region 138 and the n-type InP layer 136 surrounding the p-type region 138, while, an anode electrode 144 is in contact with the p-type region 140. The n-type InP substrate 132 in the back surface thereof provides a film 146 with low reflectivity through which an incident beam La enters the semiconductor light-receiving device 130. The back surface of the n-type InP substrate 132 has no elements having reflectivity greater than that of the film 146. The optical module installs this light-receiving device 130 on a base by, what is called, the flip-chip arrangement. Although the incident beam La output from a semiconductor laser diode enters the back surface of the light-receiving device 130, the installation of the light-receiving device 130 is not restricted to those disclosed in the prior patent document above identified.

For instance, a portion of front facet beam, which is output from the front facet of a semiconductor laser diode, is split by an optical splitter, and a light-receiving device may sense this portion of the front facet beam. Specifically, an optical splitter of a type of, what is called, the prism splitter may mount a light-receiving device on one surface thereof such that the back surface of the substrate faces and is in contact with this surface. In such an arrangement, the light-receiving device may receive the portion of the split beam output from the back surface thereof.

SUMMARY OF INVENTION

An aspect of the present invention relates to a transmitting optical module that comprises a semiconductor laser diode (LD), a first lens, a beam splitter (BS), and a semiconductor photodiode (PD). The LD emits a divergent optical beam. The first lens is optically coupled with the LD and converts the divergent optical beam into a collimated optical beam. The BS is optical coupled with the first lens and splits the collimated optical beam into a collimated monitored beam and a collimated signal beam. The PD has a semiconductor substrate and a semiconductor stack. The semiconductor substrate has a back surface and a top surface opposite to the back surface. The back surface optically couples with the BS and receives the collimated monitored beam. The top surface forms a Fresnel interface against the semiconductor stack provided thereon. A feature of the transmitting optical module of the invention is that the PD is mounted on the BS by interposing an anti-reflection film therebetween that eliminates multiple reflections caused between the top and bottom surfaces of the semiconductor substrate for the collimated monitored beam entering through the bottom surface thereof.

The transmitting optical module of the invention may further include other LDs, other first lenses, other BSs, other PDs, an optical system, and a second lens, where a total number of LDs, that of the first lenses, that of the BSs, and that of the PDs are equal to each other. The LDs emit divergent optical beams having wavelengths different from each other. The first lenses convert the divergent optical beams into collimated beams. The BSs split the collimated beams into collimated monitored beams and collimated signal beams. The PDs receive the collimated monitored beams. The optical system multiplexes the collimated signal beams into a multiplexed beam. The second lens concentrates the multiplexed beam onto an end of an optical fiber assembled with the transmitting optical module. Each of the first lenses, each of the BSs, and the second lens form the two-lens system between each of the LDs and the optical fiber. The PDs receive the collimated monitored beams. A feature of the multi-channel transmitting optical module of the present invention is that the PDs are mounted on the BSs by interposing anti-reflection films therebetween.

DESCRIPTION OF DRAWINGS

The invention will now be described by way of example only with reference to the accompanying drawings in which:

FIG. 10 schematically shows an arrangement of a semiconductor light-receiving device disclosed in a prior patent document.

DESCRIPTION OF EMBODIMENT

Next, embodiment according to the present invention will be described as referring to drawings. In the description of the embodiment, numerals or symbols same with or similar to each other will refer to elements same with or similar to each other without duplicating explanations.

Figure 1:
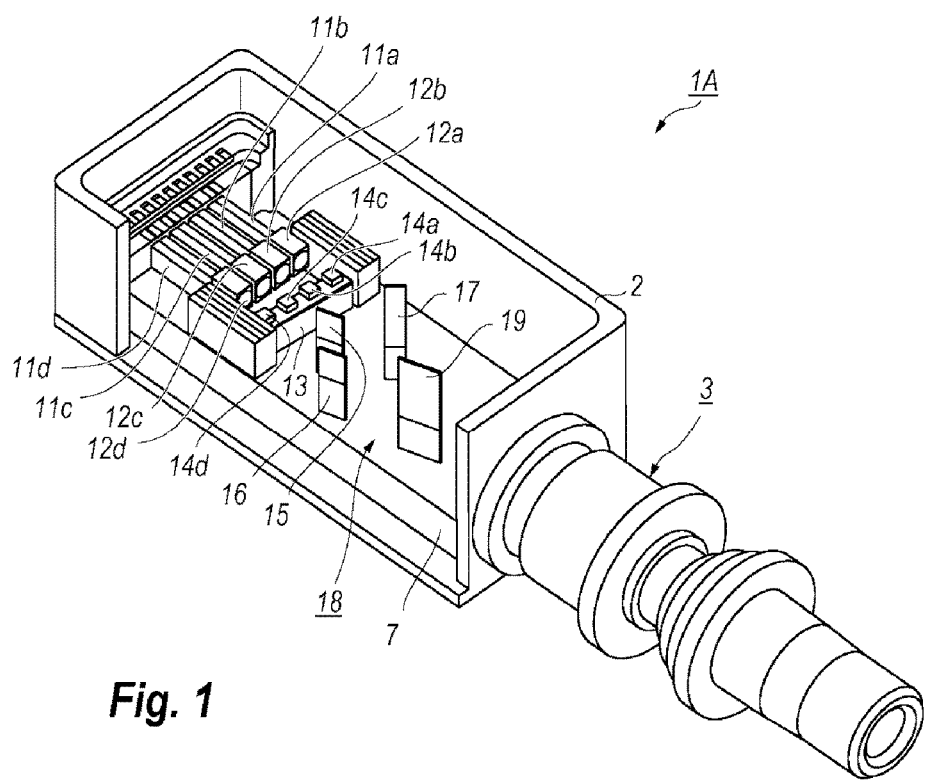
FIG. 1 shows an inside of an optical module according to one embodiment.
Figure 2:
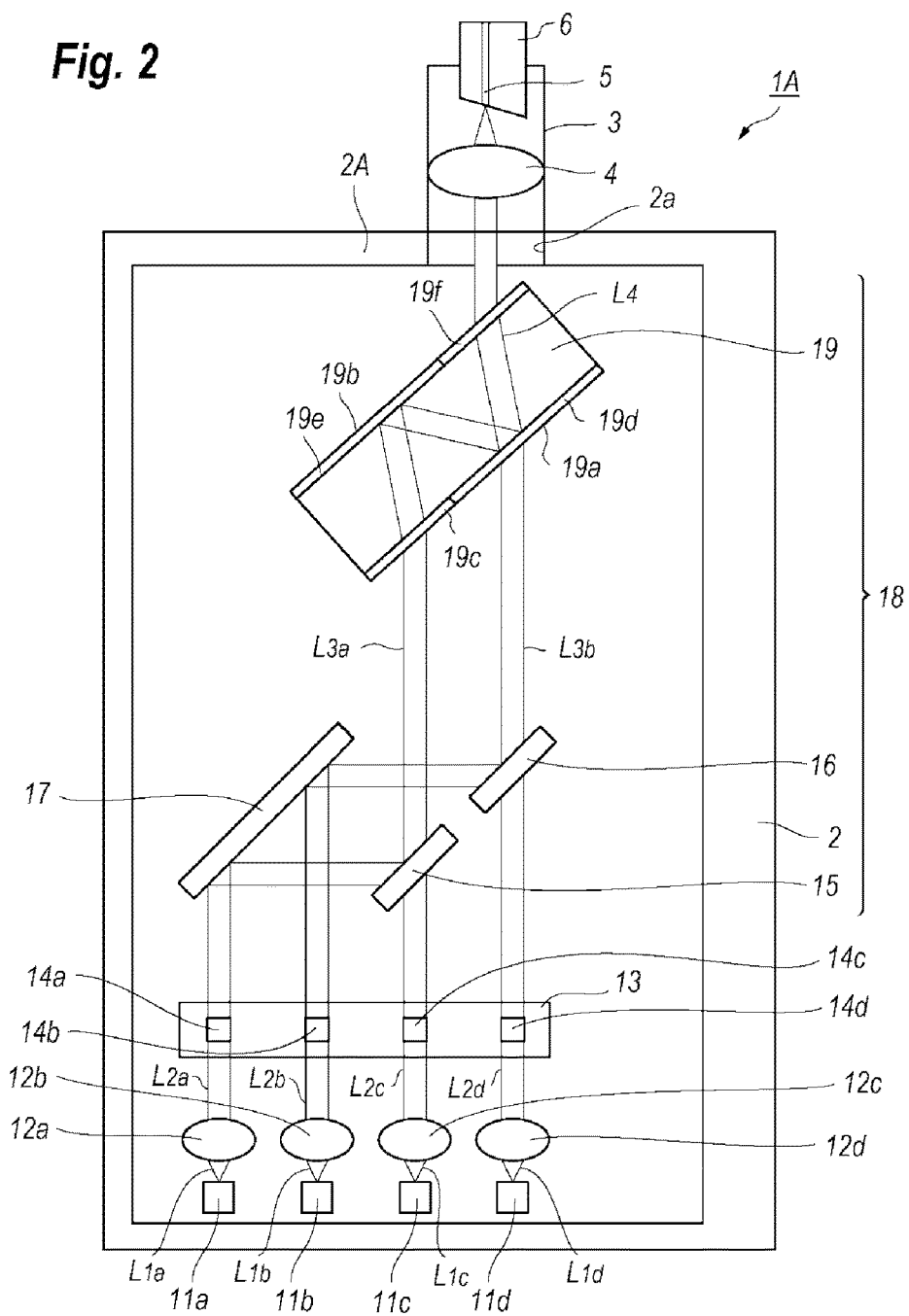
FIG. 2 is a plan view schematically illustrating the inside of the optical module.

FIG. 1 is a perspective view showing an inside of a transmitting optical module according the present invention. FIG. 2 is a plan view schematically showing an optical coupling system implemented within the optical module 1A according to the present invention. As shown in FIGS. 1 and 2, the optical module 1A is a type of, what is called as a transmitter optical sub-assembly (TOSA) having a rectangular housing 2 and a cylindrical optical coupling unit 3 with a flange. The optical module 1A also provides semiconductor laser diodes (LDs), 11a to 11d, first lenses, 12a to 12d, a beam splitter (BS) 13, photodiodes (PDs), 14a to 14d, and an optical combining system 18. The LDs, 11a to 11d, the first lenses, 12a to 12d, the BS 13, the PDs, 14a to 14d, and the optical coupling system 18 are disposed on a base 7 in a plane surface thereof. The number of the LDs, 11a to 11d, that of the first lenses, 12a to 12d, and that of the PDs, 14a to 14d, are equal to each other. That is, the optical module 1A of the embodiment is a transmitting optical module implementing four signal channels. Accordingly, the optical module 1A is sometimes called as the multi-channel transmitting optical module.

The LDs, 11a to 11d, in the optical module 1A are independently driven and emit laser beams, $L_{1a}$ to $L_{1d}$, which are divergent beams expanding from the LDs, 11a to 11d. Driving signals supplied to the LDs, 11a to 11d, are externally provided. The LDs, 11a to 11d, which may have a type of the distributed feedback (DFB) LD, are modulated with the driving signals and have wavelengths in a band of 1.3 µm but different from each other. The first lenses, 12a to 12d, are optically coupled with the LDs, 11a to 11d; specifically, the LDs, 11a to 11d, are disposed on respective focal points of the first lenses, 12a to 12d. The laser beams, $L_{1a}$ to $L_{1d}$, which are divergent beams, enter the first lenses, 12a to 12d, and are converted into collimated optical beams, $L_{2a}$ to $L_{2d}$.

Because the LDs, 11a to 11d, are not ideal point sources, the laser beams passing the first lenses, 12a to 12d, do not become exact collimated beams, name, becomes quasi-collimated beams. That is, the beams, $L_{2a}$ to $L_{2d}$, show beam waists then diverge, where the beam waist becomes a minimum field diameter.

The BS 13 are disposed on optical paths from the first lenses, 12a to 12d, to the second lenses 4, which will be described later. Further specifically, the BS13 is disposed between the first lenses, 12a to 12d, and the optical coupling system 18. The BS 13 provides a multi-layered dielectric film whose normal are inclined with optical axes of the first lenses, 12a to 12d, or with optical axes of the collimated optical beams output from the first lenses. The BS 13 splits the collimated optical beams, $L_{2a}$ to $L_{2d}$, into collimated monitored beams and collimated signal beams passing therethrough with a ratio of 5 to 10% for the collimated monitored beams. The PDs, 14a to 14d, which are mounted on the BS 13, may receive the monitored collimated beams split by the BS 13.

The optical coupling system 18, which is optically coupled with the first lenses, 12a to 12d, through the BS 13, multiplexes the collimated signal beams and includes first and second wavelength division multiplexing (WDM) filters, 15 and 16, a mirror 17, and a polarization beam combiner (PBC) 19.

The mirror 17, which optically couples with the first lenses, 12a to 12b, through the BS 13, provides a reflecting surface arranged on optical axes of the first lenses, 12a and 12b, and incline with respect to those optical axes. The mirror 17 reflects the collimated signal beams, $L_2a$ and $L_2b$, by an angle of substantially 90°.

The first WDM filter 15, which optically couples with the first lens 12c through the BS 13, has a wavelength selective surface arranged on the optical axis of the first lens 12c and inclines with respect to the optical axis thereof. The first WDM filter 15 transmits the collimated signal beam $L_{2c}$ coming from the first lens 12c concurrently with reflecting the collimated beam $L_{2a}$, which is reflected by the mirror 17, toward the PBC 19. Accordingly, the collimated signal beams, $L_{2a}$ and $L_{2c}$, align the optical axes thereof after transmitted through and reflected by the first WDM filter 15 to form a multiplexed collimated beam $L_{3a}$.

The second WDM filter 16, which optically couples with the first lens 12d through the BS 13, has a wavelength selective surface thereof on the optical axis of the first lens 12d but inclined therewith. The second WDM filter 16 transmits the collimated signal beam $L_{2d}$ coming from the first lens 12d, while, reflects another collimated signal beam $L_{2b}$ reflected by the mirror 17, thereby the collimated signal beams, $L_{2b}$ and $L_{2d}$, in the optical axes thereof may be aligned by the second WDM filter 16 and become the multiplexed collimated beam $L_{3b}$.

The PBC 19, which may be made of slab material, provides first and second surfaces, 19a and 19b, where the former surface 19a forms an anti-reflection film 19c and a polarization selective film 19f thereon, while, the latter surface 19b forms a reflecting film 19e and an anti-reflection film 19f. The anti-reflection film 19c on the first surface 19a receives the multiplexed collimated beam $L_{3a}$ coming from the first WDM filter 15. The multiplexed collimated beam $L_{3a}$ reaches the reflecting film 19e on the second surface 19b passing the PBC 19, reflected thereat, and reaches the polarization selective filter 19d on the first surface 19a. On the other hand, the other multiplexed collimated beam $L_{3b}$ coming from the second WDM filter 16 reaches the polarization selective filter 19d on the first surface 19a. Although not illustrate in FIG. 2, one of the multiplexed collimated beams, $L_{3a}$ and $L_{3b}$, passes a half wavelength ($\lambda/2$) plate before entering the PBC 19 to be rotated in the polarization thereof by 90°. Accordingly, the multiplexed collimated beams, $L_{3a}$ and $L_{3b}$, in the polarizations thereof become perpendicular to each other at the PBC 19. Thus, for instance, the multiplexed collimated beam $L_{3a}$ is reflected by the polarization selecting filter 19d, while, the other multiplexed collimated beam $L_{3b}$ passes therethrough. Accordingly, two multiplexed collimated beams, $L_{3a}$ and $L_{3b}$, are further multiplexed by the PBC 19 and output from the optical module 1A through the window 2a in the front wall 2A of the housing 2.

The optical coupling unit 3 has a cylindrical shape implementing the second lens 4, and the fiber stub 6. The second lens 4 optically couples with the optical coupling system 18, exactly, optically couples with the first lenses, 12a to 12d, through the optical coupling system 18 and the BS 13. The fiber stub 6 supports the optical fiber 5. The second lens 4 may concentrate the multiplexed collimated beam $L_4$ output from the PBC 19 on the tip end of the optical fiber 5. The coupling unit 3 is fixed, exactly welded to the front wall 2A of the housing 2 after aligned with the multiplexed collimated beam 4. The coupling unit 3, in addition to the second lens 4 and the fiber stub 5, may implement an optical isolator therein.

The optical module 1A of the present embodiment has no function to control temperatures of the LDs, 11a to 11d, the PDs, 14a to 14d, and any other optical components. Specifically, the optical module 1A does not provide a thermoelectric cooler (TEC) type of Peltier elements that electrically controls a temperature of components mounted thereon. In an optical system that allocates four wavelength channels that are relatively wider, typically called as Coarse Wavelength Division Multiplexing (CWDM); an optical signal generated by an LD may not interfere with another optical signal generated by another LD even when respective LDs are not controlled in temperatures thereof. Accordingly, removing TECs from an optical module applicable to such an optical communication system, a cost of the optical module 1A may be effectively reduced.

Figure 3:
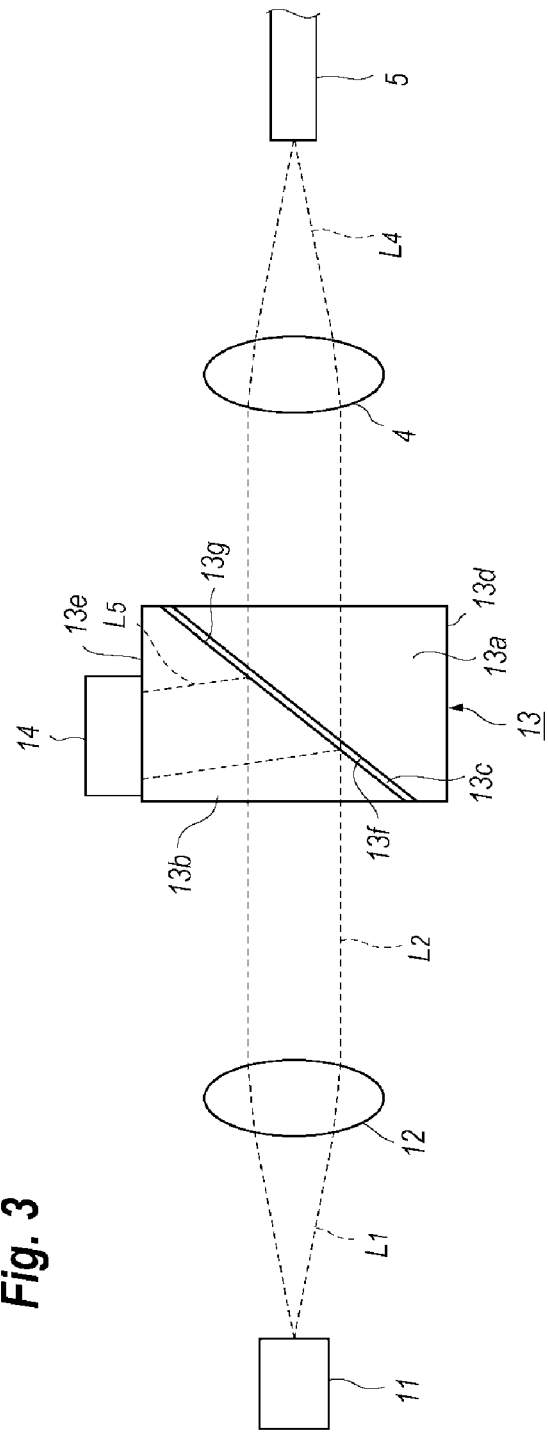
FIG. 3 schematically shows an optical coupling system implemented in the optical module.

FIG. 3 schematically shows an optical coupling system implemented in the optical module 1A, where FIG. 3 shows elements of an LD 11, a first lens 12, and a photodiode 14, which correspond to the LDs, 11a to 11d, the first lenses, 12a to 12d, and the PDs, 14a to 14d.

The laser beam $L_1$ output from the LD11, which is a divergent beam, is converted into a collimated optical beam $L_2$ by the first lens 12. This collimated optical beam $L_2$ becomes a signal beam $L_4$ passing the BS 13 and multiplexed with other collimated beam. The signal beam $L_4$ is concentrated by the second lens 4 and finally enters an optical fiber 5. A portion $L_5$ of the collimated optical beam $L_2$ split by the BS 13 enters the PD 14 from a back surface thereof as a collimated monitored beam, where the PD 14 is mounted on the BS 13.

The BS 13 comprises a first glass body 13a, a second glass body 13b, and a multi-layered filter 13c sandwiched by the glass bodies, 13a and 13b. The glass bodies, 13a and 13b, may be made of material substantially transparent for the collimated optical beam $L_2$, which is typically a glass material called as BK-7. The first glass body 13a provides a bottom 13d facing and fixed to the base 7 mounted on a base of the housing 2, and an inclined surface 13f. The second body 13b provides a top 13e on which the PD 14 is mounted, and an inclined surface 13g. Two inclined surfaces, 13f and 13g, extend parallel and face to each other and sandwich the multi-layered filter 13c therebetween. The multi-layered filter 13c in a count of the layers, and refractive indices and thicknesses of the layers may determine a split ratio of the collimated optical beam $L_2$. The inclined surfaces, 13f and 13g, make an angle with respect to the optical axis of the collimated beam $L_2$, which is slightly greater than 45°, which may set an incident angle of the monitored beam $L_5$ against the normal of the top surface 13e that is greater than 0° to eliminate backward beam returning the LD 11 reflected by an Fresnel interface between the top surface 13e and the bottom of the PD 14.

Figure 4:
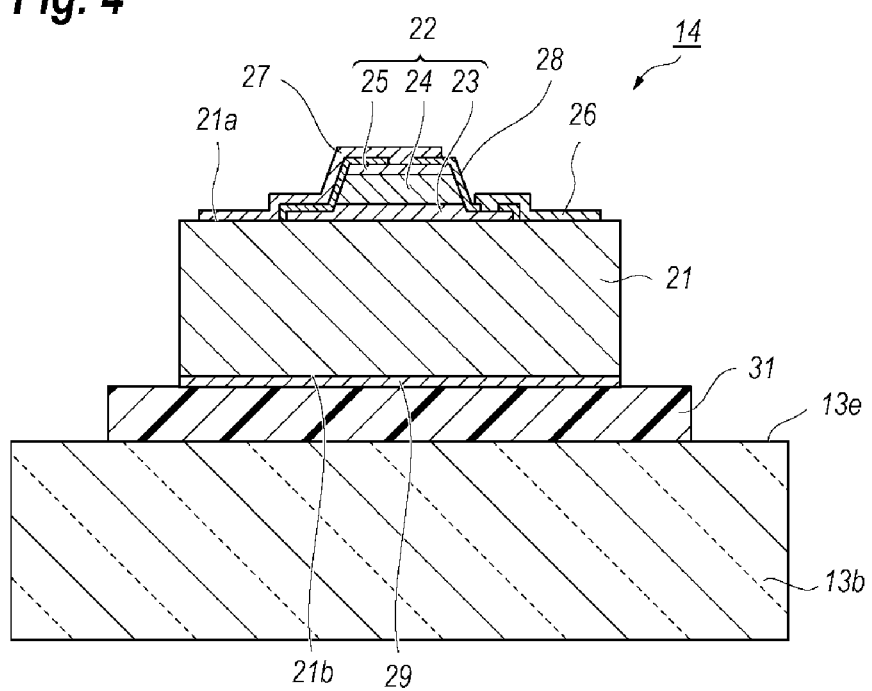
FIG. 4 shows a cross section of a photodiode (PD) and portions around the PD.

The PD 14 is mounted on the top surface 13e of the BS 13 such that the back surface of the PD 14 faces and is in contact with the top surface 13e. The PD 14 receives the collimated monitored beam $L_5$ split by the BS 13 in the back surface thereof. FIG. 4 shows a cross section of the PD 14 and a top portion of the BS 13. The PD 14 includes a semiconductor substrate 21, which may be made of, for instance, indium phosphide (InP), and a semiconductor stack 22 provided on the semiconductor substrate 21. The semiconductor substrate 21 provides a top surface 21a and a back surface 21b opposite to the top surface 21a, where the semiconductor stack 22 is provided on the top surface 21a of the semiconductor substrate 21. The back surface 21b faces and is in contact with the top surface 13e of the second glass member 13b of the BS 13.

The semiconductor stack 22, which is grown on the top surface 21a of the semiconductor substrate 21, includes a first contact layer 23, a light-receiving layer 24, and a second contact layer 25. These layers, 23 to 25, may be primarily made of ternary compound material of indium gallium arsenide (InGaAs). The first contact layer 23 shows n-type conduction, while, the second contact layer 25 shows p-type conduction. The light-receiving layer 24 may be an intrinsic type, that is, the light-receiving layer 24 is not intentionally doped with impurities. The first contact layer 23 forms a non-rectified contact with the n-type electrode 26, while, the second contact layer 25 forms another non-rectified contact with the p-type electrode 27. The semiconductor stack 22 is covered with an insulating film 28. The n-type electrode 26 and the p-type electrode 27 are in direct contact with the first contact layer 23 and the second contact layer 25, respectively, through openings formed in the insulating film 28. Also, the n-type electrode 26 and the p-type electrode 27 are electrically connected with a circuit board installed within the housing 2 through respective bonding wires, which are not illustrated in the figures.

In an alternative, the PD 14 is mounted on the BS 13 by the flip-chip bonding. However, the flip-chip bonding inherently shows a cost demerit because the BS 13 is necessary to provide metallic interconnections on surfaces thereof. Moreover, the PD 14 of the present invention detects an average of the monitored collimated beam, which means that the PD 14 is unnecessary to show substantial frequency response. Accordingly, the flip-chip bonding that reduces degradation of response around the PD 14 in higher frequencies becomes redundant. Thus, the optical module 1A of the present invention mounts the PD 14 on the BS 13 such that the back surface of the PD14 faces and is in contact with the top surface 13e of the BS 13, and the electrodes, 26 and 27, provided on the top surface of the PD 14 are wire-bonded. The split collimated beam $L_5$ enters the back surface of the PD 14, namely, the back surface 21b of the semiconductor substrate 21.

The back surface 21b of the semiconductor substrate 21 provides an anti-reflection film 29 which may be made of multi-layered dielectric film to compensate mismatch in refractive indices between the semiconductor substrate 21 and the second glass body 13b, typically silicon nitride (SiN).

The PD 14 may further provide an anti-reflection film 29 on the second contact layer 25, namely, the top surface of the PD 14. This anti-reflection film 29 may be effective even in the arrangement of the back surface illumination. The beam reaching the second contact layer 25 as passing the light-sensitive layer 24 is effectively prohibited from being reflected as the interface between the second contact layer 35 and air and rerunning the light-sensitive layer 24.

The optical module 1A may provide a transparent resin 31 between the AR film 29 and the top surface 13e of the second glass member 13b. The back surface 21b of the semiconductor substrate 21 is attached to the top surface 13e through the transparent resin 31. The transparent resin 31 may be resin filling a gap between the AR film 29 and the top surface 13e. That is, no materials except for the transparent resin 31 including air are provided in the gap between the AR film 29 and the top surface 13e. Thus, the back surface 21b of the semiconductor substrate 21 is optically coupled with the multi-layered filter 13c through the AR film 29, the transparent resin 31 and the second glass body 13b. The transparent resin 31 may be ultraviolet curable resin with refractive index thereof substantially equal to refractive index of the second glass member 13b, which is about 1.5 when the second glass member 13b is made of BK-7.

Next, subjects to be solved by the optical module 1A of the present embodiment will be described. In a conventional optical module 100 shown in FIG. 5, an additional lens 103 is put between the first and second lenses, 102 and 104, and the LD 101 is disposed in a position apart from a focal point of the first lens 102, which means that beam L output from the LD 101 is concentrated by the first lens 102 such that the beam output from the first lens 102 becomes a converging beam forming a beam waist, then collimated by the additional lens 103. The BS 113 is disposed between two lenses, 102 and 103, and provides a portion of the converging beam to the PD 114 by splitting thereby. Thus, the beam in a portion thereof split by the BS 113 heads the PD 114 as being converged.

Figure 5:
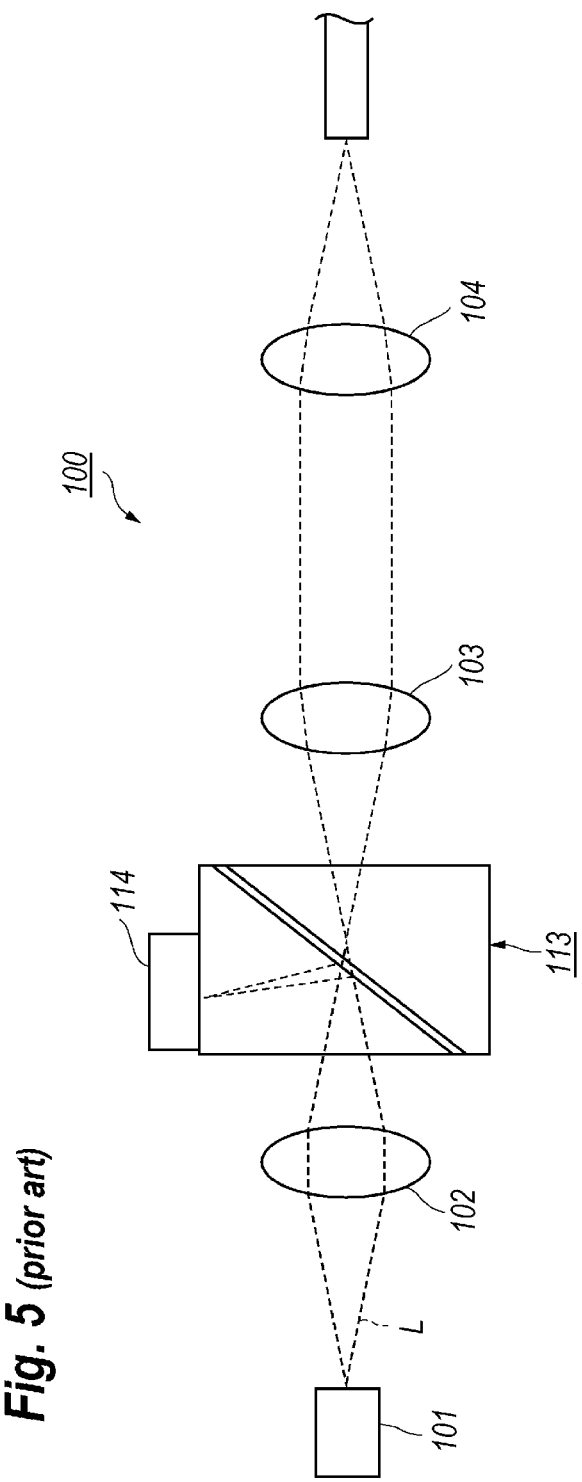
FIG. 5 shows another optical coupling system comparable with the coupling system of the present invention.

Because a conventional optical module shown in FIG. 5 has, what is called, three-lens system for coupling the laser beam L with the optical fiber. However, a lesser lens system is preferable from viewpoints of making an optical module compact and reducing costs thereof. The two-lens system of the present invention shown in FIG. 3 has been investigated; that is, the additional lens 103 is removed and the diverging laser beam L is converted into collimated beam by the first lens 102.

However, the two lens system inevitably shows a subject that the collimated beam, not a converged beam, enters the PD. Such an arrangement causes a multiple reflection within the PD and intensity of the beam entering the light-sensitive layer in the PD shows interference. Varying a temperature of the PD, or the optical module, and/or varying a wavelength of the beam entering the PD, the PD in an output thereof reflects the multiple inner reflections. An optical module implemented within an optical transmitter usually provides a function to maintain the output optical power by feed-backing the output of the PD to the bias current supplied to the LD. The variation or fluctuation of the output of the PD depending on the inner multiple reflections sets the intensity of the output of the LD instable.

Figure 6:
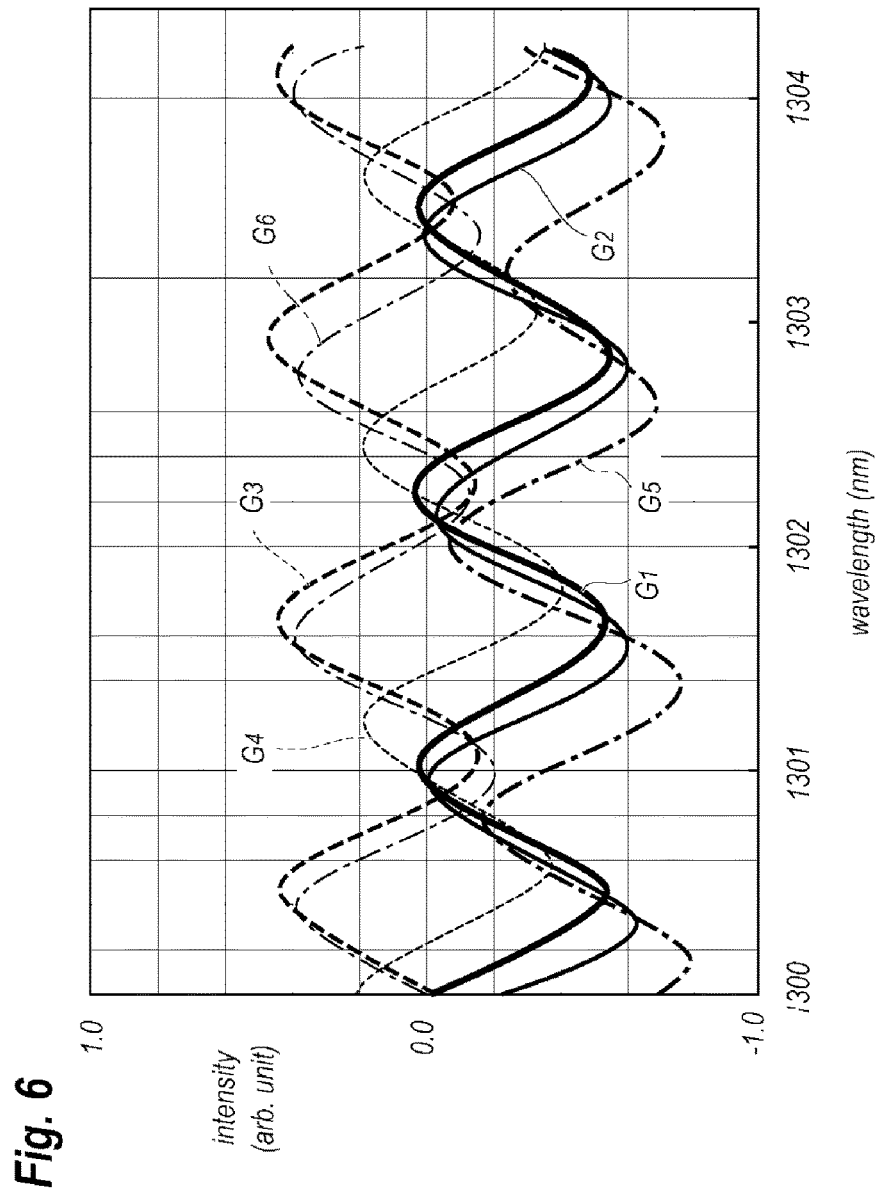
FIG. 6 shows response of the PD depending on wavelengths and temperatures when a collimated beam entering the PD keeps magnitude thereof constant.

FIG. 6 shows the dependence of the electrical output of a PD against the wavelength of the beam entering therein and the temperature thereof when the collimated beam entering the PD in power thereof is set constant, where the horizontal axis shows the wavelength while the vertical axis shows the output intensity of the PD in an arbitrary unit. Behaviors, $G_1$ to $G_6$, correspond to those taken at temperatures, 25, 40, 50, 60, 70, and 80° C. The PD in the present experiment provides no anti-reflection film on the back surface thereof through which the beam enters within the PD.

Referring to FIG. 6, the output intensity of the PD trigonometrically varies against the wavelength with amplitude of around 0.6 dB, and also depends on the temperature, which suggests the multiple reflections occurs within the PD. The behaviors, $G_1$ to $G_6$, in FIG. 6 also indicate that the trigonometrically variations show periods of about 1.3 nm. The period of the trigonometrically variation, the refractive index of InP, which forms the semiconductor substrate, and the wavelength of the collimated beam may result in a distance between the interfaces for the multiple reflections to be 203.1 µm, which is substantially equal to a thickness of the semiconductor substrate of the PD and that is 200 µm. Thus, one interface of the multiple reflections may be an interface between the semiconductor substrate and the BS, or the interface between the semiconductor substrate and the transparent resin; while, another interface may be an interface between the semiconductor substrate and the semiconductor stack.

The semiconductor substrate made of InP has refractive index of 3.20, and the BS is made of glass has refractive index of 1.50. When the semiconductor stack is made of InGaAs, refractive index is 3.92. Thus, the interface between the semiconductor substrate and the BS, and the interface between the semiconductor substrate and the semiconductor stack cause respective differences in the refractive indices thereof; that is, two interfaces each cause Fresnel reflection. Thus, the inner multiple reflections may occur within the semiconductor substrate.

In the conventional optical system shown in FIG. 6, the PD receives a converging beam L which inevitably scatters incident angles of the beam into the PD. Accordingly, the inner multiple reflections of the incoming beam may not occur, or at least may not affect the sensitivity of the PD.

In order to eliminate the multiple reflections, at least one of the interfaces between the semiconductor substrate and the BS and between the semiconductor substrate and the semiconductor stack decreases the reflection thereat. The latter interface is necessary to change semiconductor materials. However, the semiconductor materials are determined based on optical properties to realize designed function of optical-to-electrical conversion, and is hard or almost impossible to change the semiconductor material. Also, as described above, the interface between the semiconductor substrate and the semiconductor stack shows a relatively smaller difference in the refractive indices of two materials, which shows reflectively less than 1.0%. Accordingly, the decrease in the reflectivity at the interface between the semiconductor substrate and the semiconductor stack may be ineffective. The interface between the semiconductor substrate and the BS becomes effective.

That is, the present embodiment provides the PD14 having the anti-reflecting film 29 in the back surface 21b of the substrate 21. The anti-reflection film 29 may reduce Fresnel reflection at the interface between the semiconductor substrate 21 and the transparent resin 31, or the second glass member 13b of the BS 13 having refractive index substantially equal to that of the transparent resin 31.

Figure 7:
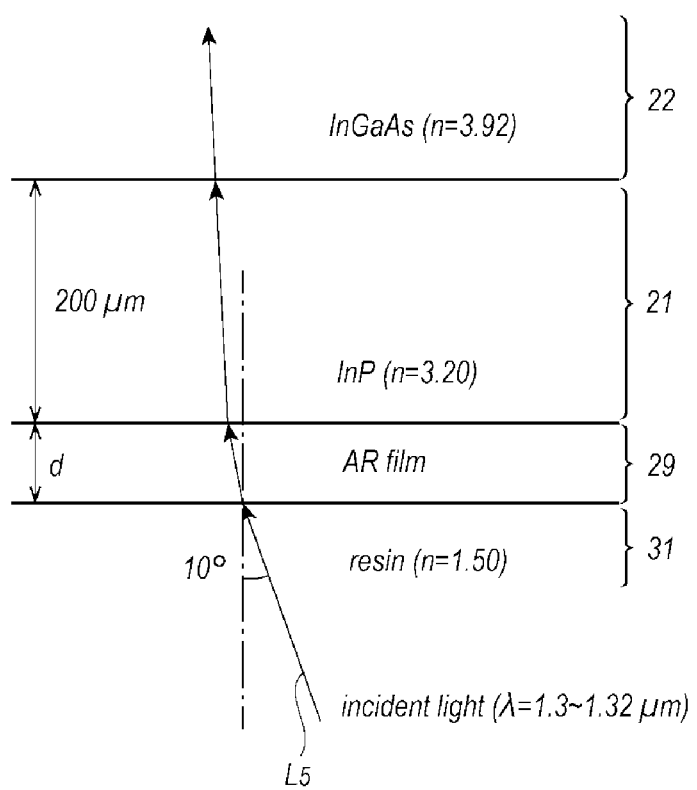
FIG. 7 schematically shows an arrangement of a transparent resin film, an anti-reflection film, a semiconductor substrate, and a semiconductor stack provided on the semiconductor substrate.
Figure 8A:
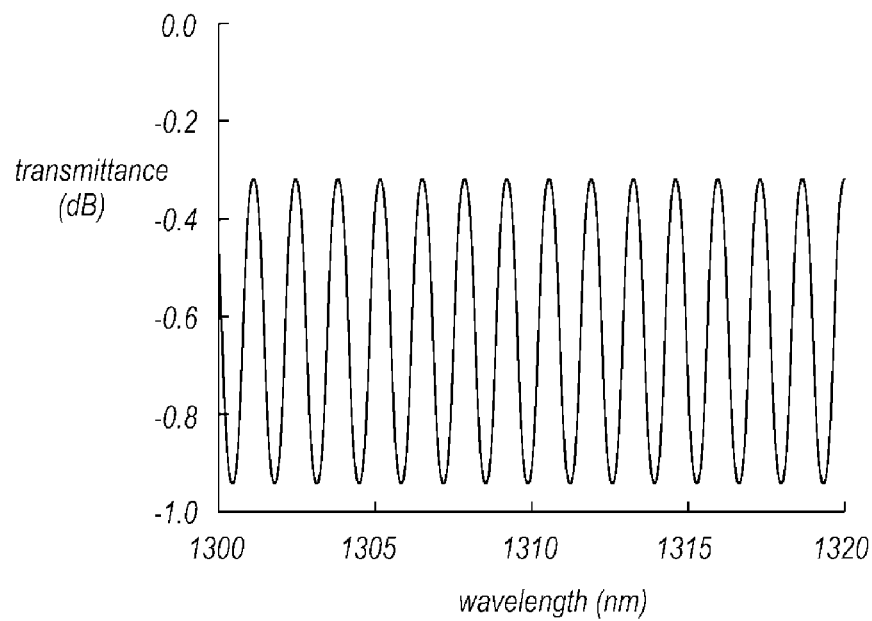
FIGS. 8A and 8B show transmittance from the transparent resin film to the semiconductor stack.
Figure 8B:
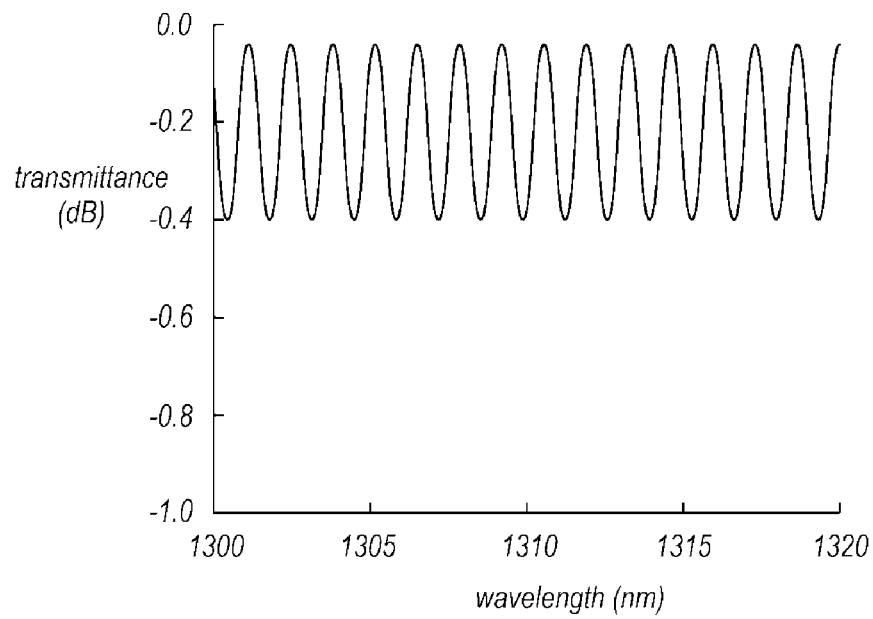

FIG. 7 schematically illustrates structure of the transparent resin 31, the anti-reflection film 29, the semiconductor substrate 21, and the semiconductor stack 22. The collimated beam $L_5$ coming from the BS 13 and having the wavelength of 1.30 to 1.32 µm enters the anti-reflection film 29 by an incident angle of 10° and reaches the semiconductor stack 29 as transmitting the anti-reflection film 29 and the semiconductor substrate 21. When no anti-reflection film 29 exists, the transmittance from the transparent resin 31 to the semiconductor stack 22 becomes that shown in FIG. 8A with a maximum of −0.343 dB and a minimum of −0.991 dB, which results in a ratio (max/mind) of 0.648 dB, and a period of 1.35 nm. On the other hand, when the structure provides the anti-reflection film 29 in the back surface 21b of the semiconductor substrate 21, where the anti-reflection film has refractive index of 1.789 and a thickness d of 0.183 µm; the transmittance thereof becomes that shown in FIG. 8B with a maximum of −0.045 dB and a minimum of −0.401 dB, which gives a ratio of 0.356 dB, and a period of 1.35 nm.

Thus, without the anti-reflection film 29, the transmittance shows the variation of 0.648 dB, but the variation becomes 0.356 dB for the arrangement with the anti-reflection film 29, which is substantially half of the former variation. Calculations of the transmittance indicates that the anti-reflection film 29 with the refractive index of 2.191 realizes no-reflection condition, the refractive index of 2.07 gives the variation in the transmittance within 0.1 dB, and the refractive indices of 2.14 to 2.16 result in the variation less than 0.05 dB.

Figure 9:
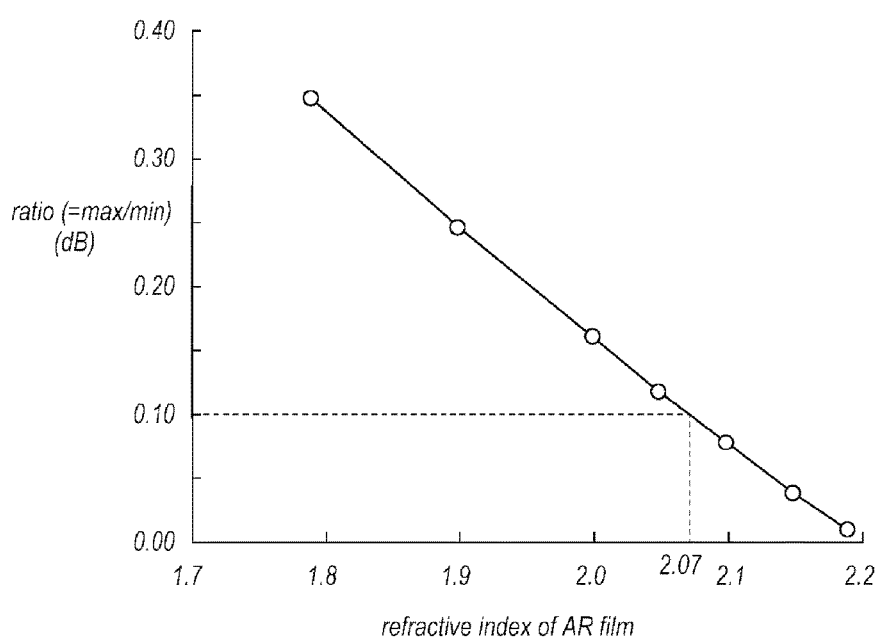
FIG. 9 shows a ratio of a maximum against a minimum of the transmittance from the transparent resin film to the semiconductor stack depending on refractive index of the anti-reflection film.

FIG. 9 shows dependence of the variation in the transmittance, that is, the ratio of the maximum transmittance against the minimum transmittance, against the refractive index of the anti-reflection film 29. It may be understood that the anti-reflection film 29 preferable has the refractive index greater than 2.07 in order to suppress the sensitivity variation of the PD 14 smaller than 0.1 dB. The anti-reflection film 29 having the refractive index substantially equal to 2.2, the Fresnel reflection at the interface between the semiconductor substrate 21 made of InP and the transparent resin 31, disappears, which means that no variation in the transmittance occurs.

Not only refractive index but a thickness of the anti-reflection film 29 affects the variation in the transmittance. Another calculation indicates that the anti-reflection film 29 has a thickness of 0.15 to 0.16 µm causes the variation in the transmittance less than 0.1 dB. An anti-reflection film made of silicon nitride (SiN) may give such conditions for eliminating the variation in the transmittance. Depending on Si composition, a SiN film may show refractive index of 1.6 to 2.5. Silicon oxy-nitride (SiON) and silicon di-oxide ($SiO_2$) that are popular materials in the field show refractive indices of about 2.0 and about 1.45 at most; accordingly, these materials are inadequate for the arrangement of the present embodiment.

An optical module applicable to, for instance, the dense wavelength division multiplexing (DWDM) system often or inevitably provides a thermo-electric controller (TEC) to keep a temperature of an LD constant to maintain a wavelength of laser beam because a wavelength span in the DWDM system is relatively narrow. The TEC mounts not only the LD but other optical components including a PD monitoring the output power of the LD. A PD whose temperature is kept constant may show substantially no variation in the transmittance, that is, a PD implemented in such a system is unnecessary to provide the anti-reflection film in the back surface of the semiconductor substrate. The optical module 1A of the embodiment provides no thermo-electric control (TEC) to control the temperature of the LD and the PD, the anti-reflection film at the back surface of the semiconductor substrate becomes effective.

Thus, the optical module 1A of the embodiment may suppress the variation of the intensity of the incident beam depending on the temperature and the wavelength. Accordingly, the LD may be stably and reliable controlled in the optical output power. Also, the optical system from the LD to the optical fiber may only provide two lenses, one of which collimates the divergent beam output from the LD and the other concentrates thus collimated beam onto the optical fiber. The optical module 1A may be formed in compact.

An optical module according to the present invention is not restricted in arrangements thereof to those of the embodiment, and various changes and modifications are applicable thereto. For instance, the PD of the embodiment provides the semiconductor substrate made of InP with the anti-reflection film in the back surface thereof and the semiconductor stack made of InGaAs. However, a PD may provide other structures and materials. Also, the embodiment provides the transparent resin between the anti-reflection film and the second glass member of the beam splitter. However, the anti-reflection film may be in direct contact with the second glass member without the transparent resin.

What is claimed is:

1. A transmitting optical module comprising:
   a semiconductor laser diode (LD) that emits a divergent optical beam;
   a first lens optically coupled with the LD, the first lens converting the divergent optical beam into a collimated optical beam;
   a beam splitter (BS) optically coupled with the first lens, the beam splitter splitting the collimated optical beam into a collimated monitored beam and a collimated signal beam, the beam splitter including a glass member; and
   a semiconductor photodiode (PD) having a semiconductor substrate made of indium phosphide (InP) and a semiconductor stack including a semiconductor layer made of indium gallium arsenide (InGaAs) on the semiconductor substrate, the semiconductor substrate having a back surface and a top surface opposite to the back surface, the back surface facing the glass member in the BS and receiving the collimated monitored beam, the top surface forming a Fresnel interface against the InGaAs semiconductor layer in the semiconductor stack provided thereon, the semiconductor substrate having a thickness causing multiple reflections between the top surface and the back surface thereof for the collimated monitored beam,
   wherein the PD is mounted on the BS and attaches an anti-reflection film thereto, the anti-reflection film being made of silicon nitride (SiN) having refractive index of 2.05 to 2.35.

2. The transmitting optical module of claim 1,
   wherein the glass member of the BS includes a first glass member, a second glass member, and a multi-layered filter, the first glass member having an inclined surface and the second glass member having another inclined surface extending substantially parallel to the inclined surface of the first glass member,
   the inclined surface of the first glass member and the inclined surface of the second glass member sandwiching the multi-layered filter therebetween and making an angle slightly greater than 45° against an optical axis of the collimated beam coming from the first lens, and
   wherein the PD is mounted on a top surface of the second glass member as the back surface of the substrate of the PD facing the top surface of the second glass member.

3. The transmitting optical module of claim 2,
   further providing a transparent resin between the anti-reflection film and the BS, the transparent resin being substantially transparent for the collimated monitored beam and having refractive index substantially equal to refractive index of the second glass member of the BS.

4. The transmitting optical module of claim 1,
   further including a base that mounts the LD, the BS, and the first lens thereon,
   wherein the LD is mounted on the base without interposing any temperature control devices and the PD is mounted on the base through the BS without interposing any temperature control devices.

5. The transmitting optical module of claim 1,
   further providing a second lens that concentrates the collimated signal beam onto an end of an optical fiber assembled with the transmitting optical module.

6. A multi-channel transmitting optical module comprising:
   a number of semiconductor laser diodes (LDs) each emitting divergent optical beams having wavelengths different from each other;
   a number of first lenses each coupled with the LDs, the first lenses converting the divergent optical beams into collimated optical beams;
   a beam splitter (BS) optically coupled with the first lenses, the beam splitter splitting the collimated optical beams into collimated monitored beams and collimated signal beams, the beam splitter including a glass member;
   a number of semiconductor photodiodes (PDs) each having semiconductor substrates made of indium phosphide (InP) and semiconductor stacks including a semiconductor layer made of indium gallium arsenide (InGaAs) on the semiconductor substrates, the semiconductor substrates having back surfaces and top surfaces opposite to the back surfaces, the back surfaces facing the glass member in the BS and receiving the collimated monitored beams therein, the top surfaces forming Fresnel interfaces against the InGaAs semiconductor layers in the respective semiconductor stacks, the semiconductor substrates having a thickness causing multiple reflections between the top surfaces and the back surfaces; and an optical coupling system that couples the collimated signal beams split by the BS with an optical fiber assembled with the transmitting optical module through a second lens, wherein the first lenses and the second lens each constitute a two-lens system between the LDs and the optical fiber, and wherein the PDs mounted on the BS attach anti-reflection films thereto, the anti-reflection films being made of silicon nitride (SiN) having refractive index of 2.05 to 2.35.

7. The multi-channel transmitting optical module of claim 6, wherein the glass member in the BS includes a first glass member, a second glass member, and a multi-layered filter, the first glass member having an inclined surface and the second glass member having another inclined surface extending substantially parallel to the inclined surface of the first glass member, the inclined surface of the first glass member and the inclined surface of the second glass member sandwiching the multi-layered filter therebetween and making an angle slightly greater than 45° against optical axes of the collimated optical beams coming from the first lenses, and wherein the PDs are mounted on the top surfaces of the second glass member of the BS as the back surfaces of the PDs facing the top surface of the second glass member.

8. The multi-channel transmitting optical module of claim 7, further providing transparent resins between the anti-reflection films and the BS, the transparent resins being substantially transparent for the collimated monitored beams and having refractive indices substantially equal to refractive index of the second glass member of the BS.

9. The multi-channel transmitting optical module of claim 6, further including a base that mounts the LDs, the first lenses, the beam splitter, and the optical coupling system thereon, wherein the LDs are mounted on a base without interposing any temperature control devices and the PDs are mounted on the base through the BS without interposing any temperature control devices.

* * * * *